US006958290B2

(12) United States Patent
Faust, Jr. et al.

(10) Patent No.: US 6,958,290 B2
(45) Date of Patent: Oct. 25, 2005

(54) METHOD AND APPARATUS FOR IMPROVING ADHESION BETWEEN LAYERS IN INTEGRATED DEVICES

(75) Inventors: Richard A. Faust, Jr., Plano, TX (US); Qing-Tang Jiang, Shanghai (CN); Jiong-Ping Lu, Richardson, TX (US)

(73) Assignee: Texas Instruments Incorporated, Dallas, TX (US)

( * ) Notice: Subject to any disclaimer, the term of this patent is extended or adjusted under 35 U.S.C. 154(b) by 93 days.

(21) Appl. No.: 10/138,393

(22) Filed: May 3, 2002

(65) Prior Publication Data

US 2003/0207562 A1    Nov. 6, 2003

(51) Int. Cl.⁷ ............... H01L 21/4763; H01L 21/44
(52) U.S. Cl. ............... 438/637; 438/642; 438/649; 438/654
(58) Field of Search ............... 438/637, 642, 438/649, 654; 257/758, 762

(56) References Cited

U.S. PATENT DOCUMENTS

| | | | |
|---|---|---|---|
| 4,873,205 A | 10/1989 | Critchlow et al. | 438/647 |
| 5,614,437 A | 3/1997 | Choudhury | 438/653 |
| 5,686,355 A | 11/1997 | Sumi et al. | 438/654 |
| 5,705,442 A | 1/1998 | Yen et al. | 438/653 |
| 5,736,192 A | 4/1998 | Okamoto | 427/99 |
| 5,796,166 A | 8/1998 | Agnello et al. | 257/751 |
| 5,913,147 A | 6/1999 | Dubin et al. | 438/687 |
| 5,926,740 A | 7/1999 | Forbes et al. | 438/763 |
| 5,972,804 A | 10/1999 | Tobin et al. | 438/786 |
| 6,001,730 A | 12/1999 | Farkas et al. | 438/627 |
| 6,017,818 A | 1/2000 | Lu | 438/65.3 |
| 6,037,013 A | 3/2000 | Hsu et al. | 427/535 |
| 6,077,780 A | 6/2000 | Dubin | 438/687 |
| 6,093,966 A | 7/2000 | Venkatraman et al. | 257/751 |
| 6,127,256 A | 10/2000 | Matsuno | 438/624 |
| 6,181,012 B1 | 1/2001 | Edelstein et al. | 257/762 |
| 6,214,731 B1 | 4/2001 | Nogami et al. | 438/687 |
| 6,271,591 B1 | 8/2001 | Dubin et al. | 257/751 |
| 6,365,511 B1 | 4/2002 | Kizilyalli et al. | 438/649 |
| 6,436,825 B1 * | 8/2002 | Shue | 438/687 |
| 6,475,912 B1 | 11/2002 | Harada | 438/687 |
| 6,498,098 B1 | 12/2002 | Abe | 438/687 |
| 2002/0006468 A1 | 1/2002 | Paranipe et al. | 427/96 |

FOREIGN PATENT DOCUMENTS

| | | | |
|---|---|---|---|
| EP | 0 869 544 A2 | 10/1998 | ......... H01L 21/285 |
| EP | 1 130 625 A2 | 9/2001 | |
| JP | 2001244216 | 9/2001 | |
| JP | 2001244265 | 9/2001 | |
| WO | WO 02/17388 A2 | 2/2002 | |

OTHER PUBLICATIONS

Quing-Tang Jiang, Rick Faust, Hieu "Robbie" Lam, and Jay Mucha, "*Investigation of Ta, TaN and TaSiN Barriers for Copper Interconnections*", National Semiconductor, Santa Clara, CA © 1999 *IEEE* IITC (99-125-127).

Stanley Wolf, Ph.D., "*Silicon Processing for the VLSI Era*", Copyright 1990 by *Lattice Press* (3 pages).

* cited by examiner

*Primary Examiner*—William M. Brewster
(74) *Attorney, Agent, or Firm*—Peter K. McLarty; W. James Brady, III; Frederick J. Telecky, Jr.

(57) ABSTRACT

In an integrated device, a via is formed in a substrate layer and a barrier layer is formed on the substrate layer in the via. A seed layer is formed on the barrier layer in the via. The seed layer includes a first material and a second material. The first material provides an ability for the second material to maintain an adherence to the barrier layer.

24 Claims, 3 Drawing Sheets

METHOD AND APPARATUS FOR IMPROVING ADHESION BETWEEN LAYERS IN INTEGRATED DEVICES

TECHNICAL FIELD OF THE INVENTION

The present invention relates generally to the field of electronic device processing and more particularly to a method and apparatus for improving adhesion between layers in integrated devices.

BACKGROUND OF THE INVENTION

The use of vias and interconnects within a complex integrated electronic device is well known. Where interconnection is maintained, current may pass through the via from one semiconductor component to another within the integrated electronic device. During the formation of interconnects and vias, various conductive layers or films are typically deposited on a substrate layer of the semiconductor component by a process, such as electroplating.

The maintenance of the interconnection between the semiconductor components is directly related to the ability of the layers to adhere to one another. The layers may be composed of a conductive material. For example, copper is often used to fill a via because of copper's relatively high electrical conductivity. Metals of high electrical conductivity, however, may resist adhering to other layers formed on the substrate. Poor adhesion of layers within a via may result in delamination at the interfaces due to thermal stress and electromigration of the conductive material as ions which make up the lattice of the conductive material move along an electric field through the weak interface. As a result, void failures along the length of the line at an interface between layers may destroy electrical contact between the semiconductor components. Therefore, it is desirable to overcome failures in semiconductor components due to the poor adhesion.

SUMMARY OF THE INVENTION

From the foregoing, it may be appreciated by those skilled in the art that a need has arisen to eliminate the weak interfaces of materials in an integrated device. In accordance with the present invention, a method and apparatus for improving adhesion between layers in integrated devices are provided that substantially eliminate or reduce at least some of the disadvantages and problems associated with the previous techniques and systems.

In accordance with a particular embodiment of the present invention, a method for improving adhesion between layers is disclosed which includes forming a via in a substrate layer and forming a barrier layer on the substrate layer in the via. Additionally, a seed layer is formed on the barrier layer in the via. The seed layer includes a first material and a second material. The first material provides an ability for the second material to maintain an adherence to the barrier layer.

The present invention provides various technical advantages over conventional semiconductor fabrication techniques. In particular embodiments, a technical advantage may be that adhesion is improved between layers formed on the substrate layer. Specifically, the second material may have bonding characteristics that may substantially improve adhesion between the seed layer and the barrier layer. Another technical advantage of particular embodiments may be that electromigration may be substantially reduced. As a result, the development of voids along the barrier layer-seed layer interface and electrical failure resulting from these voids may be substantially reduced. Another technical advantage of particular embodiments may be that diffusion of copper or other conductive material into the substrate layer may be prevented or substantially reduced. Thus, the resistivity of the barrier layer may not be compromised. A further technical advantage may be that during recrystallization of conductive material within the via, grain orientation of the conductive material may be optimized.

Embodiments of the present invention may have some, all, or none of the following technical advantages. Other technical advantages of the present invention will be readily apparent to one skilled in the art from the figures, description, and claims included herein.

BRIEF DESCRIPTION OF THE DRAWINGS

For a more complete understanding of the present invention and for further features and advantages thereof, reference is now made to the following description, taken in conjunction with the accompanying drawings, wherein like reference numerals represent like parts, in which.

DETAILED DESCRIPTION OF THE DRAWINGS

Figure 1A:
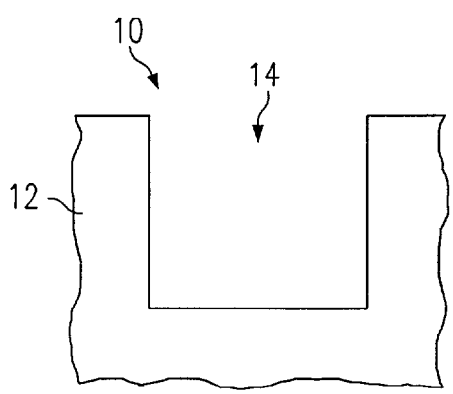
FIGS. 1A through 1F are cross-sectional diagrams of an example apparatus for improving adhesion between layers of an integrated device.

An integrated semiconductor device may include multiple semiconductor components. So that current may pass from one semiconductor component to another semiconductor component, it may be desirable to interconnect the semiconductor components. Accordingly, a via and/or trench may be etched into a layer of silicate glass or other dielectric that separates the semiconductor components. The via and/or trench in the silicate glass may be filled with conductive material. The conductive material in the via and/or trench may interconnect the semiconductor components and allow current to pass from one to the other.

During the formation of interconnects and vias, various conductive films or layers are typically deposited on a substrate layer of the semiconductor component by a process of electroplating. In particular embodiments, one or more of the conductive films may be copper. Copper may be the preferred conductive material due to its relatively high electrical conductivity and better electromigration resistance as compared with Al alloys, in conjunction with its relative low cost. In other particular embodiments, the conductive film may include palladium, gold, silver, or other appropriate conductive metal or metal alloy.

It may be desirable, however, to sufficiently separate the copper or other conductive metal from the semiconductor components by depositing various intermediary layers on the substrate layer. For example, a barrier layer may first be deposited on the substrate layer. The barrier layer material may consist of any alloy that resists the diffusion of atoms of subsequently deposited layers on the substrate layer. Although sufficient to reduce diffusion, the barrier layer material may also have conductive properties such that the current may pass through the barrier layer when flowing from one semiconductor component to another. In particular embodiments, the barrier layer may be composed of tantalum, tantalum nitride, titanium nitride, tungsten nitride, or any other appropriate material sufficient to reduce diffusion.

After deposition of the barrier layer, a seed layer may be deposited over the barrier layer. The seed layer may be of the same conductive material that is used during the electroplating process or it may be of a different conductive material. Regardless of the composition of the conductive seed layer, the primary purpose of the seed layer is to adhere to the barrier layer and to provide a nucleation layer for the electroplated film. As will be described below in greater detail, metals of high electrical conductivity may resist adhering to the barrier layer. Thus, it may be desirable to intersperse a quantity of bonding material in the seed layer with other conductive material. The quantity of bonding material, such as silicon, interspersed with the copper or the other conductive material of the seed layer may be great enough to provide the conductive material with the ability to maintain adherence to the barrier layer. The quantity of silicon may not, however, be so great as to inhibit current flow from one semiconductor component to another semiconductor component or to effect the resistivity of the barrier layer.

FIGS. 1A through F are cross-sectional diagrams of an example apparatus 10 for improving adhesion between layers of an integrated device in accordance with one embodiment of the present invention.

FIG. 1A illustrates a semiconductor component of an integrated device comprising a substrate layer 12. The substrate layer 12 may be made of a dielectric material. In particular embodiments, substrate layer 12 may be made of fluorinated silicate glass, organosilicate glass, or any other appropriate polymer. A via 14 is formed in substrate layer 12, preferably through a conventional etching process. Via 14 may form a trench through a portion of the substrate layer 12. Via 14 may then be filled with one or more layers of conductive material such that current may pass through the via from one semiconductor component to another.

Figure 1B:
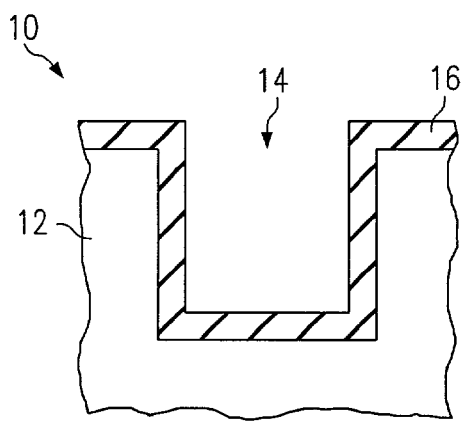

FIG. 1B illustrates the semiconductor component after a barrier layer 16 is formed on the substrate layer 12. Barrier layer 16 may act as a barrier separating the substrate layer 12 from any subsequent layer placed thereon. Barrier layer 16 may also resist diffusion of particles from any later layers placed onto the substrate layer 12 and into via 14. For example, if copper is later placed on barrier layer 16, barrier layer 16 will resist diffusion of copper particles through the barrier layer 16 and into the substrate layer 12. Thus, the resistivity of the barrier layer 16 may be important. Barrier layer 16 may include titanium, titanium nitride, tungsten nitride, or any appropriate material of sufficient resistivity to prevent the diffusion of conductive particles within via 14 into the substrate layer 12. However, barrier layer 16 material must also have conductive properties such that a current may pass through the barrier when flowing from one metal component to another.

Figure 1C:
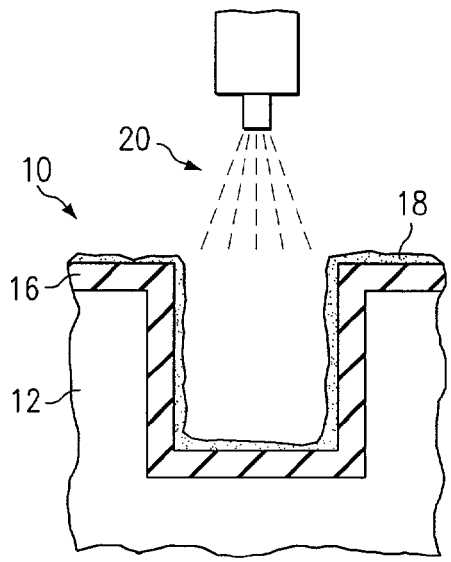

FIG. 1C illustrates the semiconductor component of the integrated device during formation of a seed layer 18. Seed layer 18 may be formed on the barrier layer 16. The primary purpose of seed layer 18 is to adhere to the barrier layer 16 and to provide a nucleation layer for the electroplated film. Seed layer 18 may be of the same conductive material as the conductive material used during the electroplating process to fill via 14. If for example, copper is used in the electroplating process to fill via 14, seed layer 18 may also include copper. The use of copper, however, is merely exemplary. Any other appropriate conductive material may be used as seed layer 18 and to fill via 14 to interconnect the metal components.

In alternative embodiments, the conductive material of the seed layer 18 may be different from the conductive material used to fill via 14. Thus, many modifications and substitutions may be made to the formation of the interconnect. All such modifications and substitutions are within the scope and spirit of the present invention.

Copper and other conductive materials of relatively high electrical conductivity may resist bonding to the barrier layer 16. To increase adhesive characteristics of the conductive material in seed layer 18, it may be desirable to intersperse a quantity of bonding material in the conductive material during deposition of the seed layer 18.

In a particular embodiment, a silicon containing target material 20 may be deposited as seed layer 18. The target material 20 may include silicon interspersed in a copper alloy such as Cu—Mg, Cu—Sn, Cu—In, Cu—Zr, or any other conductive material that may be appropriately used as seed layer 18. The use of copper is merely exemplary, and target material 20 may include silicon interspersed with any material that may be appropriately used as seed layer 18. The use of silicon is also exemplary as the bonding material may include any material which may aid in the adherence of seed layer 18 to barrier layer 16. Regardless of the composition of the target material 20, the bonding material interspersed with the conductive material of the seed layer 18 may be of sufficient quantity to act as a bonding agent. The quantity of silicon may be sufficient enough to cause the conductive material of the seed layer 18 to adhere to the barrier layer 16. The quantity of silicon may not, however, be so great as to inhibit the flow of current through the via 14.

The silicon-containing target material 20 may be formed on the barrier layer 16, preferably by a conventional vapor deposition process. Various vapor deposition processes are readily available to one of ordinary skill in the art. Vapor deposition processes usually take place within a vacuum chamber. There are generally two categories of vapor deposition processes: physical vapor deposition (PVD) and chemical vapor deposition (CVD). In PVD processes, the work piece is subjected to plasma bombardment. PVD methods are clean dry vacuum deposition methods in which the coating is deposited over the entire object simultaneously rather than in localized areas. The deposition process may conclude with plasma bombardment of the target to ensure a dense, hard coating. PVD methods differ in the means for producing the metal precursor and the details of plasma creation. The primary PVD methods are ion plating, ion implantation, sputtering, and laser surface alloying.

Alternatively, the silicon containing target material 20 may be deposited on the barrier layer 16 by a CVD process. In CVD processes, thermal energy heats the gases in the coating chamber and drives the deposition reaction. CVD is a method of forming coatings using the decomposition of relatively high vapor pressure gases. Gaseous compounds of the materials to be deposited are transported to a substrate surface where a thermal reaction/deposition occurs.

Figure 1D:
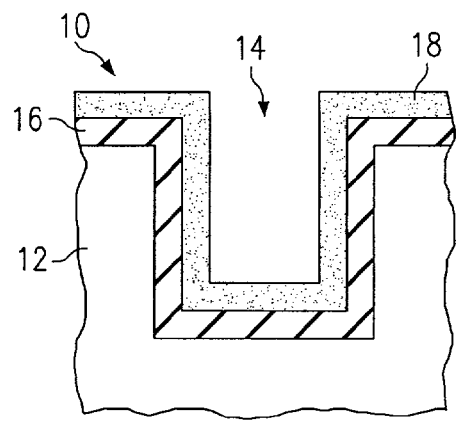

FIG. 1D illustrates the semiconductor component of the integrated device after formation of the seed layer 18. A uniform coating of target material 20 covers barrier layer 16. Formation of the seed layer 18 prepares the via for further deposition of the conductive fill material. As previously described, the substitution of silicon containing target material 20 for non-silicon containing metal alloys during deposition of the seed layer 18 may increase adhesive characteristics of the conductive material in the seed layer 18. Thus, as a technical advantage, deposition of silicon-containing target material 20 as seed layer 18 may increase the ability of the seed layer 18 to adhere to the barrier layer 16.

Improved adhesion may also prevent electromigration of the conductive material. Electromigration is generally considered to be the result of momentum transfer from electrons, which move in the applied electric field, to ions which make up the lattice of the interconnect material. As a result of the electromigration of seed layer 18, void failures along the length of the line may destroy electrical contact. Accordingly, it may be desirable to prevent electromigration by interspersing silicon with the conductive material during deposition of the seed layer. If the conductive material more readily adheres to the barrier layer 16, electromigration and electrical failure of interconnects may be substantially reduced.

Figure 1E:
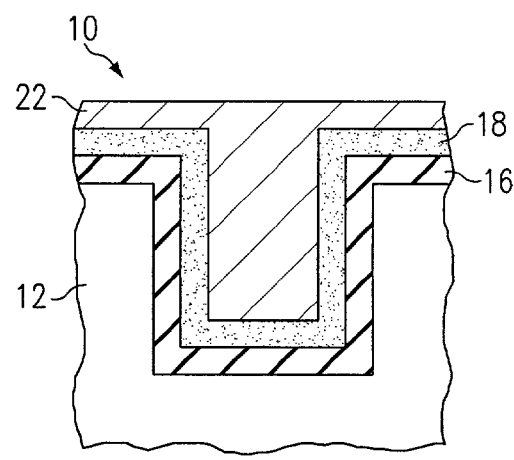

FIG. 1E illustrates the semiconductor component of the integrated device after fill material 22 is deposited in a remaining portion of via 14. Fill material 22 may include electroplate material deposited in the via by generally known electroplating processes. The electroplate material may include copper or other appropriate metal of relatively high electrical conductivity. Fill material 22 may form an interconnection between one semiconductor component and another and allow current to pass between the semiconductor components.

Figure 1F:
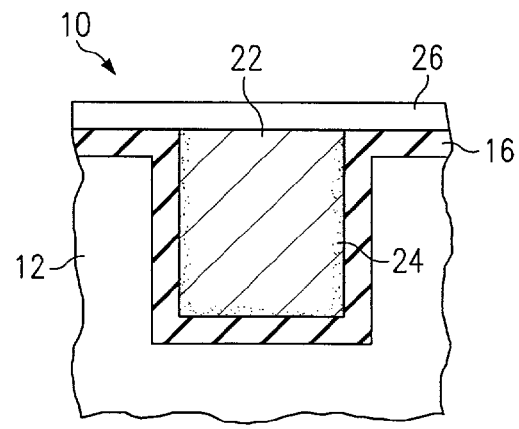

If the fill material 22 is deposited during electroplating processes, the fill material 22 and the conductive material of seed layer 18 may recrystallize such that the two layers may become substantially indistinguishable. Accordingly, FIG. 1F illustrates the semiconductor component after the conductive materials of the fill material 22 and seed layer 18 have recrystallized. In particular embodiments, bonding material 24 of seed layer 16 may remain near the barrier layer 16 and improve adhesion of the conductive material of seed layer 18 to the barrier layer 16. Accordingly, electromigration of conductive particles may be prevented or substantially reduced. During recrystallization, conductive material such as copper may break down into grains. As a result bonding material 24 that was originally interspersed in target material 20 may migrate toward the grain boundaries or toward the barrier layer-seed layer interface. If bonding material 24 is deposited on or near the barrier layer 16 as was described above in regard to FIG. 1C, the particles of bonding material 24 may have a natural predisposition to migrate toward the barrier layer 16. Accordingly, adhesion between the conductive material of the seed layer 18 and the barrier layer 16 may be substantially improved. Additionally, the grain orientation within the seed layer 18 may be optimized.

Referring again to FIG. 1F, as well as being filled with a conductive fill material 22, the via has been capped. Semiconductor component 26 rests over the filled via 14. Thus, interconnect and via 14 may allow current to pass from the semiconductor component 26 to another semiconductor component coupled by fill material 22 within via 14.

Figure 2A:
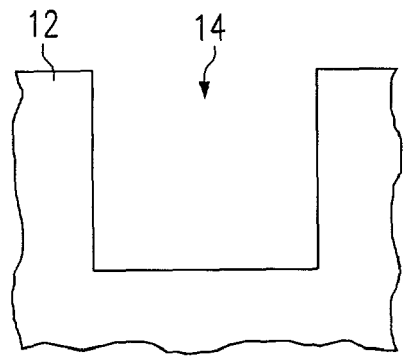
FIGS. 2A through 2D are cross-sectional diagrams of another example apparatus for improving adhesion between layers of an integrated device.
Figure 2B:
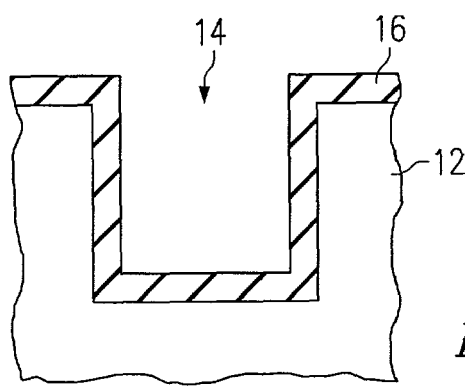

FIGS. 2A through D are cross-sectional diagrams of an example apparatus for improving adhesion between layers of an integrated device according to another embodiment of the present invention. In this embodiment, via 14, substrate layer 12, and barrier layer 16, as depicted in FIGS. 2A and 2B, are formed as previously described in connection with FIGS. 1A and 1B.

Figure 2C:
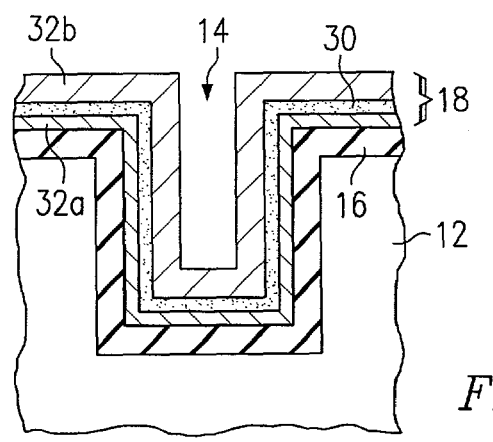

FIG. 2C illustrates a semiconductor component after formation of a seed layer 18. In the particular embodiment depicted, the seed layer 18 includes at least one bonding layer 30 interspersed between two or more conductive layers 32. As previously described, conductive layers 32 may include copper or any other material of relatively high electrical conductivity. As an initial stage in the formation of seed layer 18, a first conductive layer 32a may be formed immediately on barrier layer 16. The first conductive layer 32a may be relatively thin in comparison to the thickness of the entire seed layer 18. Because copper and other conductive materials of relatively high electrical conductivity may resist bonding to the barrier layer 16, a bonding layer 30 may be formed on the first conductive layer 32a. Bonding layer 30 may include silicon or other appropriate material for increasing the bonding characteristics of the conductive material in the conductive layer 32a. The bonding layer 30 may be of sufficient thickness to enable conductive layer 32a to adhere to the barrier layer 16. The thickness of bonding layer 30 may not, however, be so great as to inhibit the flow of current through the via 14 or affect the resistivity of the barrier layer 16.

After the formation of bonding layer 30, a second conductive layer 32b may be formed on bonding layer 30. The second conductive layer 32b may be relatively thick in comparison to the relative thicknesses of the bonding layer 30 and the first conductive layer 32a. Thus, second conductive layer 32b may compose the majority of the seed layer 18.

Seed layer 18 may be deposited in via 14 by PVD processes, CVD process, or any other conventional formation process. As previously described with regard to FIG. 1C, PVD processes rely primarily on the physical bombardment and removal of coating material from a target disk by energized inert ions. PVD processes result in simultaneous disposition of the coatings over the entire object, rather than disposition in localized areas. The liberated material is then deposited on the surface of the integrated device. CVD processes, on the other hand, rely on the chemical reaction of gaseous species above the surface. The reaction products then form a layer on that surface.

As previously described, deposition of seed layer 18 prepares the via for further deposition of conductive fill material 22. The bonding layer 30 placed near the barrier layer 16 may increase the adhesive characteristics of conductive layers 32. Thus, bonding layer 30 may provide conductive layers 32 with the ability to adhere to the barrier layer 16 even during recrystallization. Improved adhesion between the barrier layer 16 and the seed layer 18 may prevent electromigration of conductive fill material 22 deposited in the remaining space within via 14. Additionally, recrystallization may result in the migration of the bonding layer 30 toward the barrier layer-seed layer interface. Because bonding layer 30 may be initially deposited near the barrier layer-seed layer interface, the particles of bonding material in bonding layer 30 may be naturally predisposed to migrate toward the barrier layer-seed layer interface. The presence of bonding layer 30 may also result in optimization of grain orientation within the seed layer 18.

Figure 2D:
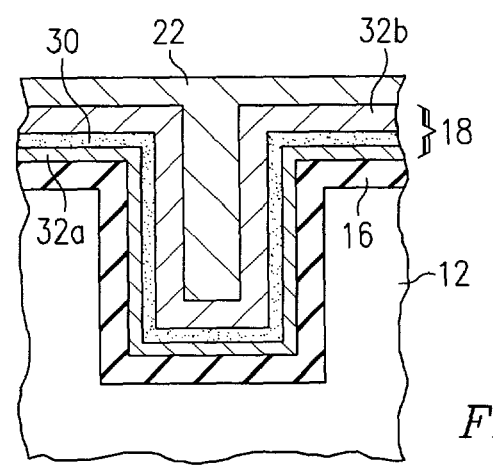

Conductive fill material 22, as depicted in FIG. 2D, is formed as previously described in connection with FIGS. 1E and 1F. Upon recrystallization, conductive layers 32 and bonding layer 30 of seed layers 18 and conductive fill material 22 may become substantially indistinguishable. Additionally, via 14 may be capped and a semiconductor component placed thereon. The conductive material within the fill material 22 and the seed layer 18 may then interconnect the semiconductor component to another semiconductor component and facilitate the flow of current from one to the other.

Figure 3A:
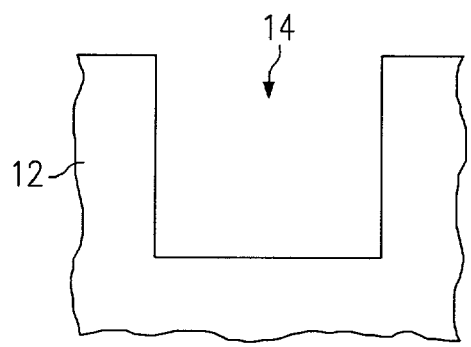
FIGS. 3A through 3D are cross-sectional diagrams of another example apparatus for improving adhesion between layers of an integrated device.
Figure 3B:
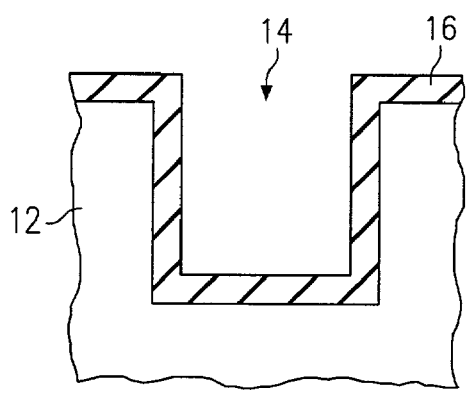

FIGS. 3A through 3D are cross-sectional diagrams of an example apparatus for improving adhesion between layers of an integrated device according to another embodiment of the present invention. In this embodiment, via 14, substrate layer 12, and barrier layer 16, as depicted in FIGS. 3A and 3B, are formed as previously described in connection with FIGS. 1A and 1B and FIGS. 2A and 2B.

Figure 3C:
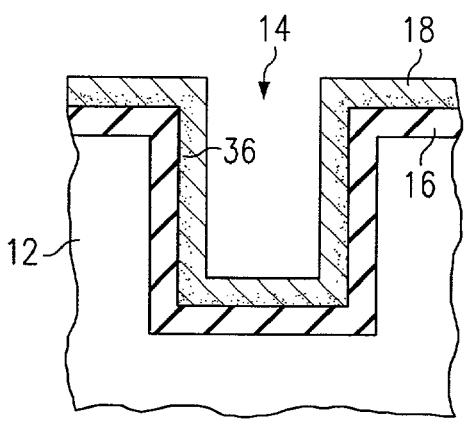

FIG. 3C illustrates the metal component after formation of the seed layer 18. In the particular embodiment depicted, a gas that contains a bonding material 36 may be introduced as conductive material is deposited in the seed layer 18. As previously described, conductive material deposited in the seed layer 18 may include copper or any other material of relatively high electrical conductivity. For example, conductive material within the seed layer 18 may include copper or a copper alloy. The seed layer 18 may be deposited directly on the barrier layer 16 by PVD processes, CVD processes, or any other appropriate technique for the deposition of seed layer 18.

As conductive material is dispersed along barrier layer 16, the gas that includes bonding material 36 may be simultaneously introduced to the barrier layer 16. Bonding material 36 may include silicon or any other appropriate material for increasing the adherence of conductive materials within the seed layer 18 to the barrier layer 16. For example, the gas may be $SiH_4$. The use of silane gas, however, is merely exemplary. Any other gas that may be mixed with an appropriate bonding material 36 may be used.

In particular embodiments, the ratio of gas to conductive material may remain substantially constant throughout the entire deposition of seed layer 18. As such, the concentration of bonding material 36 may be uniform throughout the entire seed layer 18. Alternatively, the ratio of gas to conductive material may be varied throughout the deposition of seed layer 18 to achieve a desired profile of bonding material 36. For example, it may be desirable to increase the concentration of bonding material 36 near the barrier layer-seed layer interface. Thus, the ratio of gas to conductive material may be greater at the beginning of the deposition of seed layer 18 and be reduced as the deposition of seed layer 18 progresses. In particular embodiments, the concentration of gas may be steadily reduced such that the portion of the seed layer 18 furthest from the barrier layer 16 may not contain any bonding material 36.

As previously described, deposition of seed layer 18 prepares the via for further deposition of conductive fill material. The presence of bonding material 36 near the barrier layer 16 may increase the adhesive characteristics of conductive materials within the seed layer 18. A technical advantage of the above described embodiment may include bonding material 36 providing an ability for the seed layer 18 to maintain adherence to the barrier layer 16. As previously described, improved adhesion between the barrier layer 16 and the seed layer 18 may prevent delamination and electromigration of conductive fill material 22 deposited in the remaining portion of via 14. Additionally, recrystallization may result in the migration of bonding material 36 toward the barrier layer-seed layer interface. Because bonding material 36 may be initially deposited near the barrier layer-seed layer interface, the particles of bonding material 36 may be naturally predisposed to migrate toward the barrier layer 16. The presence of bonding material 36 may also result in optimization of grain orientation within the seed layer 18.

Figure 3D:
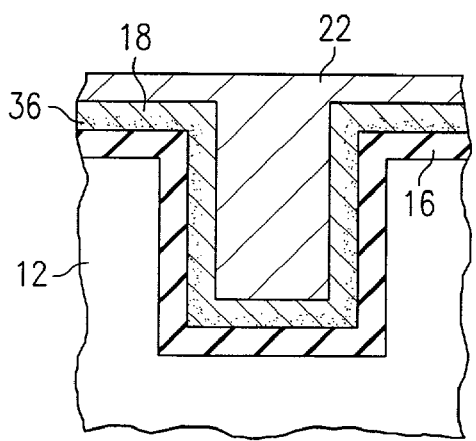

Conductive fill material 22, as depicted in FIG. 3D, is formed as previously described in connection with FIGS. 1E and 1F and FIG. 2D. Upon recrystallization, conductive material and bonding material 36 within the seed layer 18 and conductive fill material 22 may become substantially indistinguishable. Additionally, via 14 may be capped and a semiconductor component placed thereon. The conductive material of fill material 22 and seed layer 18 may then interconnect the semiconductor component to another semiconductor component and facilitate the flow of current from one to the other.

Although the present invention has been described with several embodiments, numerous changes, substitutions, variations, alterations, transformations, and modifications may be suggested by one skilled in the art and it is intended that the present invention encompass all such changes, substitutions, variations, alterations, transformations, and modifications as fall within the spirit and scope of the appended claims.

What is claimed is:

1. A method for improving adhesion between layers, comprising:
   forming a via in a substrate layer;
   forming a barrier layer on the substrate layer in the via;
   forming a seed layer on the barrier layer in the via, the seed layer including a first material and a second material, the first material providing an ability for the second material to maintain an adherence to the barrier layer.

2. The method of claim 1, wherein the substrate layer includes a dielectric material.

3. The method of claim 1, wherein the barrier layer includes a substantially non-conductive material.

4. The method of claim 1, wherein the point at which the seed layer and barrier layer abut is a barrier layer-seed layer interface, the barrier layer operable to:
   separate the seed layer from the substrate layer; and
   substantially resist diffusion of the second material through the barrier layer-seed layer interface.

5. The method of claim 1, wherein forming the seed layer includes depositing a target material, the target material including silicon as the first material and copper as the second material.

6. A method for improving adhesion between layers, comprising:
   forming a via in a substrate layer;
   forming a barrier layer on the substrate layer in the via;
   forming a seed layer on the barrier layer in the via, the seed layer including a first material and a second material, the first material providing an ability for the second material to maintain an adherence to the barrier layer wherein forming the seed layer includes introducing a silicon-containing gas as the first material to the second material during formation.

7. The method of claim 6, further comprising:
   varying the flow of silicon-containing gas during deposition of the seed layer to control the concentration of silicon in the seed layer.

8. The method of claim 7, wherein the point at which the seed layer and barrier layer abut is a barrier layer-seed layer interface, the concentration of the first material greatest near the barrier layer-seed layer interface.

9. The method of claim 1, wherein forming the seed layer includes:
   forming a first layer of the second material on the barrier layer;
   introducing a layer of the first material on the first layer of the second material; and
   forming a second layer of the second material on the layer of the first material.

10. The method of claim 9, wherein the second layer of the second material is free of the first material.

11. The method of claim 1, further comprising:
depositing a fill material in a remaining portion of the via, the fill material being a conductive metal.

12. A method for improving adhesion between layers, comprising:
forming a via in a substrate layer;
forming a barrier layer on the substrate layer in the via;
forming a seed layer on the barrier layer in the via, the seed layer including a first material and a second material, the first material providing an ability for the second material to maintain an adherence to the barrier layer wherein forming the seed layer includes co-depositing a concentration of silicon as the first material with a conductive metal as the second material, the concentration of silicon great enough to increase adhesion between the seed layer and the barrier layer.

13. An apparatus for improving adhesion between layers, comprising:
a substrate layer having a via;
a barrier layer formed on the substrate layer in the via;
a seed layer formed on the barrier layer in the via, the seed layer including a first material and a second material, the first material providing an ability for the second material to maintain an adherence to the barrier layer.

14. The apparatus of claim 13, wherein the substrate layer includes a dielectric material.

15. The apparatus of claim 13, wherein the barrier layer includes a substantially non-conductive material.

16. The apparatus of claim 13, wherein the point at which the seed layer and barrier layer abut is a barrier layer-seed layer interface, the barrier layer operable to:
separate the seed layer from the substrate layer; and
substantially resist diffusion of the second material through the barrier layer-seed layer interface.

17. The apparatus of claim 13, wherein the seed layer includes a target material having silicon as the first material and copper as the second material.

18. The apparatus of claim 13, wherein the seed layer is formed by introducing a silicon-containing gas to the second material during formation.

19. The apparatus of claim 16, wherein the point at which the seed layer and barrier layer abut is a barrier layer-seed layer interface, the concentration of the first material greatest near the barrier layer-seed layer interface.

20. The apparatus of claim 13, wherein the seed layer comprises:
a first layer of the second material on the barrier layer;
a layer of the first material on the first layer of the second material; and
a second layer of the second material on the layer of the first material.

21. The apparatus of claim 20, wherein the second layer of the second material is free of the first material.

22. The apparatus of claim 13, further comprising:
a fill material formed in a remaining portion of the via, the fill material being a conductive metal.

23. The apparatus of claim 13, wherein the first material includes silicon, the concentration of silicon great enough to increase adhesion between the seed layer and the barrier layer.

24. A method for improving adhesion between layers, comprising:
forming a via in a substrate layer, the substrate layer including a dielectric material;
forming a barrier layer on the substrate layer in the via, the barrier layer including a substantially non-conductive material;
forming a seed layer on the barrier layer in the via, the seed layer including silicon and copper, the silicon providing an ability for the copper to adhere to the barrier layer, the barrier layer operable to:
separate the seed layer from the substrate layer;
substantially resist diffusion of the copper through the barrier layer into the substrate layer.

* * * * *